(12) United States Patent
Fuchigami et al.

(10) Patent No.: US 6,219,286 B1
(45) Date of Patent: Apr. 17, 2001

(54) SEMICONDUCTOR MEMORY HAVING REDUCED TIME FOR WRITING DEFECTIVE INFORMATION

(75) Inventors: Ikuo Fuchigami; Tomonori Kataoka; Youichi Nishida; Tomoo Kimura; Ken Kawai, all of Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/586,992

(22) Filed: Jun. 5, 2000

(30) Foreign Application Priority Data

Jun. 4, 1999 (JP) .................................................. 11-157913

(51) Int. Cl.[7] ....................................................... G11C 7/00
(52) U.S. Cl. ...................................... 365/200; 365/230.03
(58) Field of Search ................................. 365/200, 230.03

(56) References Cited

U.S. PATENT DOCUMENTS 5,666,314 * 9/1997 Akaogi et al. ....................... 365/200

FOREIGN PATENT DOCUMENTS

| 5-159597 | 6/1993 | (JP) . |
| 6-28888 | 2/1994 | (JP) . |
| 8-50798 | 2/1996 | (JP) . |
| 8-335399 | 12/1996 | (JP) . |

* cited by examiner

Primary Examiner—David Nelms
Assistant Examiner—M. Tran
(74) Attorney, Agent, or Firm—Wenderoth, Lind & Ponack, L.L.P.

(57) ABSTRACT

The present invention provides a semiconductor memory which can reduce the area of a circuit for replacing defective memory cells with redundant memory cells as well as reduce the time for writing defect information. The semiconductor memory of the present invention comprises a memory cell array 1 comprising (n+1) (n is a positive integer) word lines, a register unit 4 holding an encoded defect address for specifying a defective word line, a defect address decoder 31 for decoding the defect address from the register unit 4 to specify the defective word line, selection means S1~Sn for selecting, for the i-th ($1 \leq i \leq n$) output signal line of a row decoder 2, one of the i-th and i+1-th word lines and connecting the selected word line to the i-th output signal line, and control means C1~Cn each controlling corresponding one of the selection means S1~Sn on the basis of an output of the defect address decoder 31 so as to select, for the output signal line of the row decoder 2, one of the word lines except the defective word line in accordance with the arrangement order.

17 Claims, 13 Drawing Sheets

134a fuse element 134b nonvolatile memory element

SEMICONDUCTOR MEMORY HAVING REDUCED TIME FOR WRITING DEFECTIVE INFORMATION

FIELD OF THE INVENTION

The present invention relates to semiconductor memories and, more particularly, to semiconductor memories which include nonvolatile memory cells and enable to replace defective memory cells with redundant memory cells.

BACKGROUND OF THE INVENTION

In recent years, in flash memories as nonvolatile semiconductor memories, increased storage capacities and subdivided manufacturing processes result in decreases in the yields. In order to suppress these decreases in the yields, semiconductor memories can avoid a defect in memory cells using redundancy by replacing the faulty defective memory cells with spare memory cells are required.

Japanese Published Patent Application No.5-159597 discloses an example of these semiconductor memories. FIG. 7 is a diagram schematically illustrating a structure of this conventional semiconductor memory.

In FIG. 7, a memory cell array 101 includes memory cells (shown as MC in the figure) which are connected to (n+1) (n: positive integer) word lines WL1~W1n+1 and m (m: positive integer) bit lines BL1~BLm, and arranged like a matrix. Selection circuits Sa1~San in a redundancy control circuit 103 switch connections between signal lines R1~Rn of a row decoder 102 and the corresponding word lines WLn–WLn+1, respectively. Control cells Ca1~Can each have a fuse element or nonvolatile memory cell (not shown) containing defect information. output lines of the control cells Ca1~Can are connected to the selection circuits and their adjacent control cells, respectively.

The operation of the semiconductor memory having the above-described structure will be described. The row decoder 102 decodes an input row address, and outputs a decoded result to the signal lines R1~Rn. The selection circuits Sa1~San receive the outputs of the control cells Ca1~Can, and perform the switching. In this case, the i-th ($1 \leq i \leq n$) selection circuit Sai selects the word line WLi when the output of the control cell Cai is for example "L" (Low level), and selects the word line WLi+1 when the output is "H" (High level) . The control cell Cai contains defect information of WLi. The control cell Cai outputs "H" when the defect information indicates the word line WLi has a defect or the output of Cai−1 is "H", and outputs "L" in other cases.

For example, when there is a defective memory cell MC in the i-th word line WLi, the defect information is recorded in the control cell Cai, and as for k satisfying the relationship $1 \leq k < i$, the selection circuits Sk are controlled so as to select WLk for Rk and as for j satisfying the relationship $i \leq j \leq n$, the selection circuits Sj are controlled so as to select WLj+1 for Rj. That is, the redundancy control circuit 103 replaces defective memory cells with redundant memory cells by shifting the connections of the i-th and subsequent selection circuits to the word lines so as to skip the defective word line WLi as shown in FIG. 7.

The prior art semiconductor memory comprises the control cells each having the fuse element or nonvolatile memory cell containing the defect information, for all row lines. Accordingly, when the number of row lines is increased in the case of the control cells having the fuse elements, the area of the redundancy control circuit is increased and more time is required for disconnecting the fuse elements. In the case of the control cells having the nonvolatile memory cells, the area is increased due to addition of circuits for writing data, the time for recording data is increased, and further examination of memory cells which contain the defect information separately from the memory cell array is required.

SUMMARY OF THE INVENTION

It is an object of the present invention to provide a semiconductor memory which can reduce the areas of circuits for replacing defective memory cells with redundant memory cells as well as reduce the time for writing the defect information.

Other objects and advantages of the present invention will become apparent from the detailed description and specific embodiments described are provided only for illustration since various additions and modifications within the spirit and scope of the invention will be apparent to those of skill in the art from the detailed description.

A semiconductor memory according to a 1st aspect of the present invention comprises a memory cell array comprising plural internal connection lines including at least one spare internal connection line, which are arranged successively, and plural memory cells, at least one of which memory cells is connected to each of the internal connection lines; plural external connection lines which are arranged successively; plural selection means, each of which is connected to one of the plural external connection lines and selects either an internal connection line of the plural internal connection lines which is in an arrangement order corresponding to an arrangement order of the connected external connection line or one of at least one internal connection line which is arranged subsequently to the internal connection line, thereby to connect the selected line to the external connection line; a register unit holding an encoded address for specifying at least one defective internal connection line among the internal connection lines, as a defect address; a defect address decoder for decoding the defect address output by the register unit and specifying the defective internal connection line; and plural control means which are provided in correspondence with the plural selection means, each control means controlling the selection of the internal connection line by each of the selection means, so as to select one of the plural internal connection lines except the defective internal connection lines for one of the plural external connection lines according to its arrangement order, on the basis of an output of the defect address decoder. Therefore, the register unit can hold the encoded defect addresses whose number is equal to the number of the spare internal connection lines, whereby it is not required to provide the fuse elements or nonvolatile memory cells for specifying defective internal connection lines, for all the internal connection lines. Accordingly, the area of the circuit for replacing defective memory cells with redundant memory cells can be reduced. Besides, since the register unit contains the encoded defect addresses, the semiconductor memory which enables to reduce the time for writing the defect information can be provided.

According to a 2nd aspect of the present invention, in the semiconductor memory of the 1st aspect, the control means are successively connected each other according to the arrangement orders of the corresponding plural external connection lines, each of the control means outputting a signal for controlling the selection of the internal connection line, to a corresponding one of the selection means and a control means just after that control means, as well as generating the signal for controlling the selection of the internal connection line, which is output to the corresponding one of the selection means, on the basis of a signal which is input by the defect address decoder and a signal for controlling the selection of the internal connection line, which is input by a control means connected just before that control means.

According to a 3rd aspect of the present invention, in the semiconductor memory of the 1st aspect, the plural internal connection liens are (n+2) (n is an positive integer) internal connection lines including two spare internal connection lines; the plural external connection lines are "n" external connection lines; the register unit holds up to two defect addresses for specifying up to two defective internal connection lines; the plural control means are at least "n" control means; and the plural selection means are at least "n" selection means, each selecting either an internal connection line of the (n+2) internal connection lines which is in the arrangement order corresponding to the arrangement order of the external connection line, or one of two internal connection lines which are arranged subsequently to the internal connection line, and connecting the selected internal connection line to the external connection line.

According to a 4th aspect of the present invention, in the semiconductor memory of the 1st aspect, the register unit internally has redundancy information recording means comprising plural fuse elements or plural nonvolatile memory cells, and keeps the defect address in the redundancy information recording means.

According to a 5th aspect of the present invention, the semiconductor memory of the 1st aspect comprises the control means and the selection means, numbers of which means are both equal to a number of the internal connection lines, and the control means controls the selection means, respectively, thereby selecting all of the memory cells including the memory cell connected to the spare internal connection line at the time of examination of the memory cell array. Therefore, the semiconductor memory which can easily examine the memory cells can be provided.

According to a 6th aspect of the present invention, the semiconductor memory of the 1st aspect comprises the memory cell array including a redundancy information block having plural memory cells which contain redundancy information including the defect address; data reading means for reading the data which are stored in the memory cell array; and reading control means for controlling the data reading means to read the defect address from the redundancy information block and store the read defect address in the register unit. Therefore, the redundancy information block can be examined in the same examination procedure as that of the normal memory cells, whereby the semiconductor memory which enables to simplify the examination can be provided.

According to a 7th aspect of the present invention, the semiconductor memory of the 6th aspect comprises the redundancy information comprising the defect address and information for correcting errors in the defect address; and data decision means for subjecting the redundancy information which is read from the redundancy information block by the data reading means to the error correction, extracting the defect address, and outputting the defect address to the register unit. Therefore, the semiconductor memory which can normally replace defective memory cells with redundant memory cells even when the redundancy information block which is not subjected to the replacement has a defect and the redundancy information has an error can be provided.

According to an 8th aspect of the present invention, the semiconductor memory of the 6th aspect comprises power-on detection means for detecting the semiconductor memory is powered on; the memory cells in the redundancy information block comprising nonvolatile memory cells; and the reading control means for controlling the data reading means to read the redundancy information from the redundancy information block and store the defect address in the read redundancy information in the register unit, when the power-on detection means detect the semiconductor memory is powered on. Therefore, the setting of the register unit for controlling the redundancy can be performed without requiring the control from outside.

According to a 9th aspect of the present invention, in the semiconductor memory of any of the 1 to 6 aspects, the memory cell array consists of plural nonvolatile memory cell which are arranged in a matrix; and the internal connection liens are word lines and spare word lines of the memory cell array.

According to a 10th aspect of the present invention, in the semiconductor memory of the 9th aspect, the memory cells are floating gate type nonvolatile memory cells.

A semiconductor memory according to an 11th aspect of the present invention comprises a memory cell array comprising plural erase blocks including a spare erase block, which are arranged successively, in units of erase blocks each consisting of plural internal connection lines which are arrange successively and plural memory cells, at least one of which memory cells is connected to each of the internal connection lines; a block decoder for selecting one of the erase blocks; a row-in-block decoder for selecting one of the internal connection lines in the erase block selected by the block decoder; plural selection means which are respectively connected to plural outputs of the block decoder, which are arrange successively, each of the selection means selecting either an input to the row-in-block decoder in an arrangement order corresponding to an arrangement order of an output of the block decoder among plural inputs to the row-in-block decoder which are arranged successively, or one of at least one input to the row-in-block decoder which is arranged subsequently to the input, and connecting the selected input to the output of the block decoder; a register unit holding an encoded address for specifying an input corresponding to a defective erase block among the plural inputs to the row-in-block decoder, as a defect address; a defect address decoder for decoding the defect address output by the register unit, to specify one of the inputs to the row-in-block decoder, corresponding to the defective erase block; and control means which are provided in correspondence with the plural selection means, each of the control means controlling the selection of the input to the row-in-block decoder by each of the selection means on the basis of an output of the defect address decoder so as to select, for each of the plural outputs of the block decoder, one of the plural inputs to the row-in-block decoder except the input to the row-in-block decoder corresponding to the defective erase block, in accordance with the arrangement order. Therefore, the register unit can hold the encoded defect addresses whose number is equal to the number of the spare erase blocks, whereby it is not required to provide the fuse elements or nonvolatile memory cells for specifying defective erase blocks, for all the inputs to the row-in-block decoder. Accordingly, the area of the circuit for replacing a defective memory cell with a redundant memory cell can be reduced. Besides, since the register unit contains the encoded defect addresses, the time for writing the defect information can be reduced. Further, since the defective memory cells are replaced in erase block units, the interference occurring at the time of erasure or writing due to the defective memory cells can be avoided.

According to a 12th aspect of the present invention, the semiconductor memory of the 11th aspect comprises: the memory cell array comprising a redundancy information block having plural memory cells which contain redundancy information including the defect address; data reading means for reading the data stored in the memory cell array; and reading control means for controlling the data reading means to read the redundancy information from the redundancy information block and store the defect address in the read redundancy information in the register unit.

DETAILED DESCRIPTION OF THE PREFERRED EMBODIMENTS

[Embodiment 1]

Figure 1:
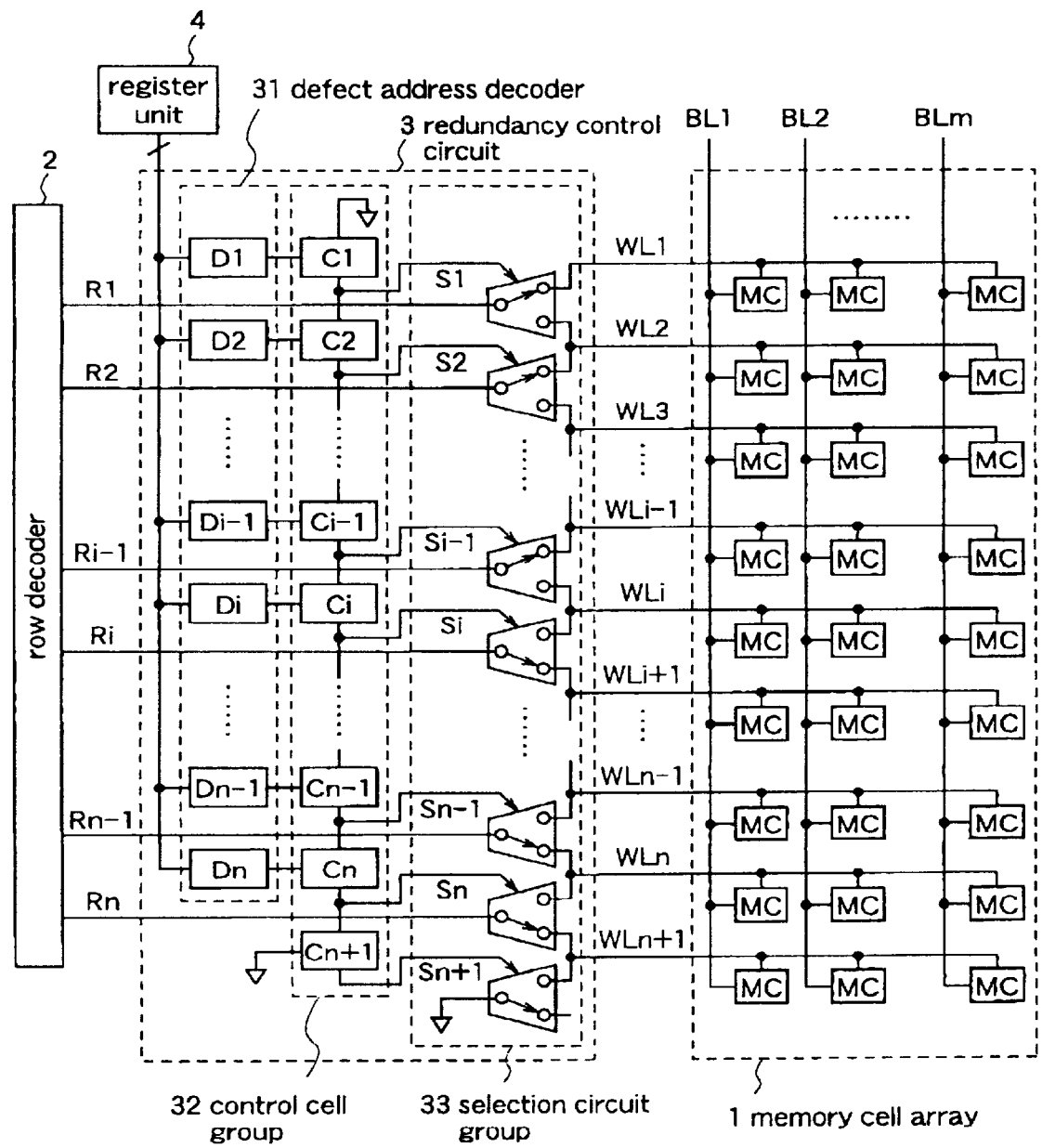
FIG. 1 is a circuit diagram illustrating a semiconductor memory according to a first embodiment of the present invention.

FIG. 1 is a circuit diagram illustrating a structure of a semiconductor memory according to a first embodiment of the present invention. In FIG. 1, a memory cell array 1 includes plural memory cells MC which are connected to successively arranged word lines WLi~WLn+1 and bit lines BL1~BLm, and arranged like a matrix. As the memory cells in this case, nonvolatile memory cells, more particularly, floating gate type nonvolatile memory cells are employed. Memory cells which are not nonvolatile can be also employed. A row decoder 2 decodes an input row address, and outputs a decoded result to signals lines R1~Rn which are arranged successively. A redundancy control circuit 3 controls the connections between the signal lines R1~Rn and the word lines WLi~WLn+1. A register unit 4 holds a defect address encoded as the defect information.

In the redundancy control circuit 3, a selection circuit group 33 comprises selection circuits S1~Sn each being connected to one of the successively arranged output signal lines R1~Rn of the row decoder 2, and switches connections of the output signal lines R1~Rn of the row decoder 2 to the corresponding word lines WL1~WLn+1, respectively. To be specific, each of the selection circuits S1~Sn performs switching so as to connect each of the output signal lines R1~Rn of the row decoder 2 to which signal line each of the selection circuits is connected, to either a word line which has the arrangement order corresponding to the arrangement order of each of the output signal lines R1~Rn or a word line which is arranged subsequently to that word line. For example, assuming that Ri is the i-th output signal line, Si is the i-th selection circuit, and the word lines WLi and WLi+1 are the i-th and i+1-th word lines, respectively, the output signal line Ri which is connected to the selection circuit Si is connected to either the word line WLi or word line WLi+1. A selection circuit Sn+1 switches the connection between a word line WLn+1 and the ground.

A defect address decoder 31 comprises defect address decoding cells D1~Dn which are provided in correspondence with the selection circuits S1~Sn, and the defect address decoding cells D1~Dn are connected to the register unit 4, respectively. Each of the defect address decoding cells D1~Dn decodes the defect address which is output from the register unit 4.

A control cell group 32 comprises control cells C1~Cn which are respectively connected to the defect address decoding cells D1~Dn in the defect address decoder 31. The control cells C1~Cn are connected to the selection circuit S1~Sn, respectively, and control the switching of the selection circuits S1~Sn, respectively. The control cells C1~Cn are successively connected each other according to the arrangement orders of the corresponding output signal lines R1~Rn. Each of the control cells outputs a control signal which is output to the selection circuit to perform the switching of a defective word line, to a control cell which is connected just after that control cell. Each of the control cells C1~Cn controls the switching of each of the selection circuits S1~Sn on the basis of an output of the control cell which is connected just before that and an output of the corresponding one of the defect address decoding cells D1~Dn. That is, when a signal specifying a defective word line is output by any of the defect address decoding cells D1~Dn, or when a control signal informing occurrence of a defect is input by a previous and adjacent control cell, each of the control cell controls the switching of each of the selection circuits S1~Sn so as to switch the word line which is connected to the output signal line of the row decoder 2 from the word line corresponding to the arrangement order of the output signal line of the row decoder 2 to the word line which is arranged subsequent to that word line. Accordingly, the control cells C1~Cn control the switching of the selection circuits S1~Sn, respectively, so as to select word lines except the defective word line among the word lines WL1~WLn+1 according to their arrangement orders, and connect the output signal lines R1~Rn to those word lines. A control cell Cn+1 has the same structure as those of the control cells C1~Cn, and controls the switching of the selection circuit Sn+1.

Figure 12:
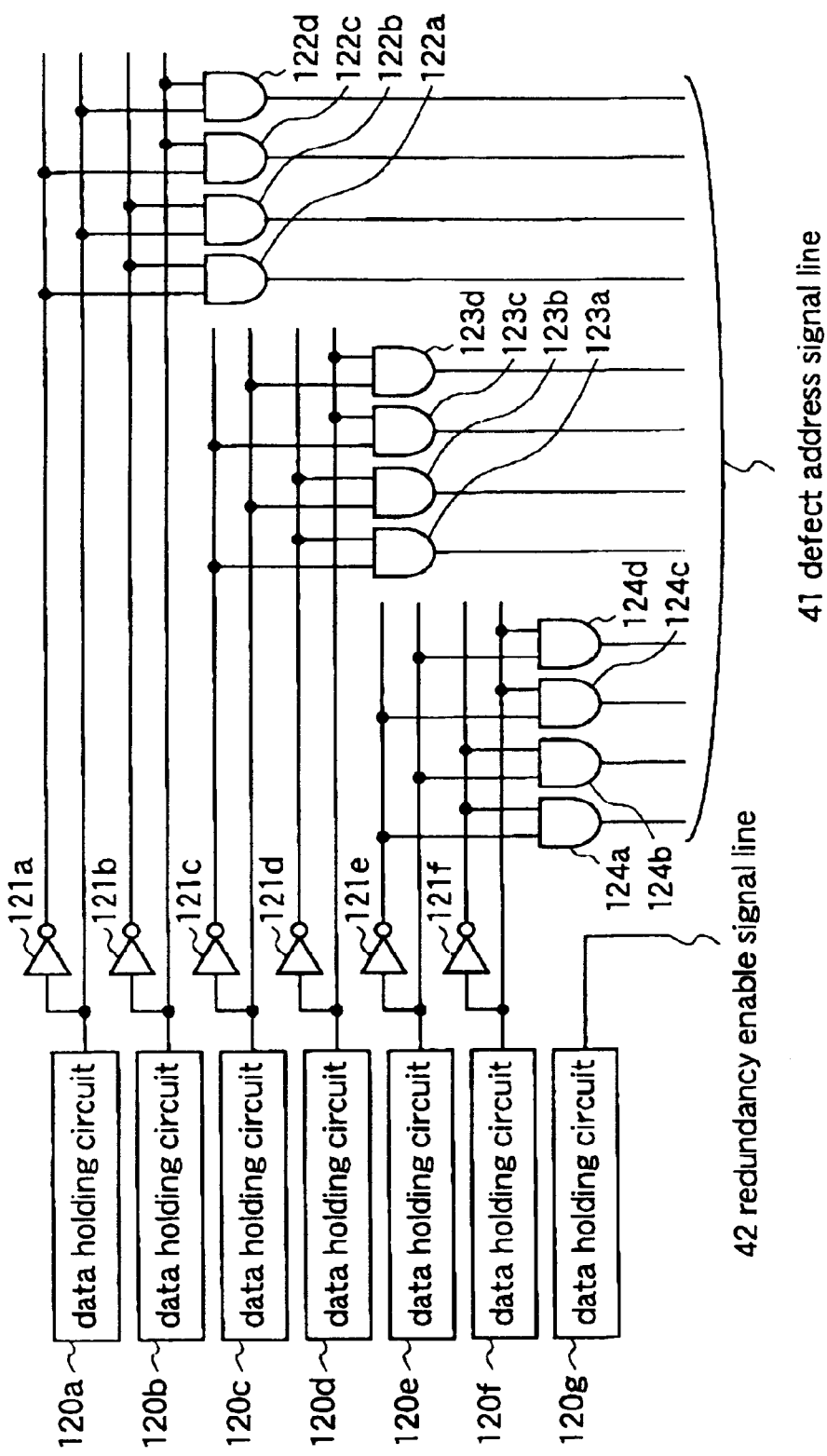
FIG. 12 is a circuit diagram illustrating a register unit of the semiconductor memory according to the first embodiment.

FIG. 12 is a diagram illustrating a detailed structure of the register unit 4 in the semiconductor memory according to the first embodiment. Here, the description is given of a case where a 6-bit encoded defect address is employed. In this figure, data holding circuits 120a~120f each hold 1-bit data, resulting in holding the 6-bi defect address. A data holding circuit 120g outputs a redundancy enable signal via a redundancy enable signal line 42. The data holding circuits 120a~120g constitute a redundancy information recording means. Inverters 121a~121f each output an inverted signal of the output of each of the data holding circuits 120a~120f, in parallel with the original output. AND circuits 122a~122d each receive two of four outputs which are output by the data holding circuits 120a and 120b and the inverters 121a and 121b. The combinations of two outputs which are respectively received by the AND circuits 122a~122d differ. AND circuits 123a~123d each receive two of four outputs which are output by the data holding circuits 120c and 120d and the inverters 121c and 121d, and the combinations of two outputs which are respectively received by the AND circuits 123a~123d differ. AND circuits 124a~124d each receive two of four outputs which are output by the data holding circuits 120e and 120f and the inverters 121e and 121f, and the combinations of two outputs which are respectively received by the AND circuits 124a~124d differ. Outputs of the AND circuits 122a~122d, the AND circuits 123a~123d and the AND circuits 124a~124d are output as a pre-decoded defect address though a defect address signal line 41. One of the AND circuits 122a~122d outputs "1" according to the combinations of data which are held by the data holding circuits 120a and 120b. Similarly, one of the AND circuits 123a~123d outputs "1" according to the combinations of data which are held by the data holding circuits 120c and 120d, and one of the AND circuits 124a~124d outputs "1" according to the combinations of data which are held by the data holding circuits 120e and 120f.

Figure 13:
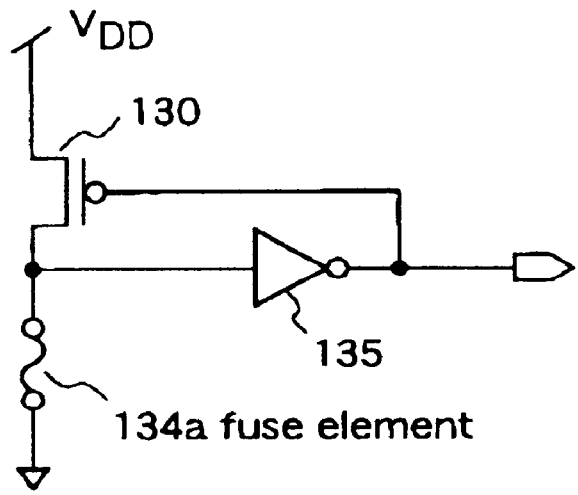
FIG. 13 is a circuit diagram illustrating a data holding circuit in the register unit of the semiconductor memory according to the first embodiment.

FIG. 13 is a circuit diagram illustrating a structure of each of the data holding circuits 120a~120f in the register unit 4 as shown in FIG. 12. This figure shows the data holding circuit which has a fuse element 134a as the means containing data. A P-type MOS transistor 130 has a source which is connected to a power supply voltage VDD, and a drain which is connected to the input of an inverter 135 as well as grounded via the fuse element 134a. The output of the inverter 135 is input to a gate of the P-type MOS transistor 130 as well as output as the output of each of the data holding circuits 120a~120f. When the fuse element 134a is connected to the inverter 135, the inverter always outputs "1" and the P-type MOS transistor 130 is always OFF. When the fuse element is disconnected, the inverter 135 outputs "0" and the P-type MOS transistor 130 is turned ON.

Figure 14:
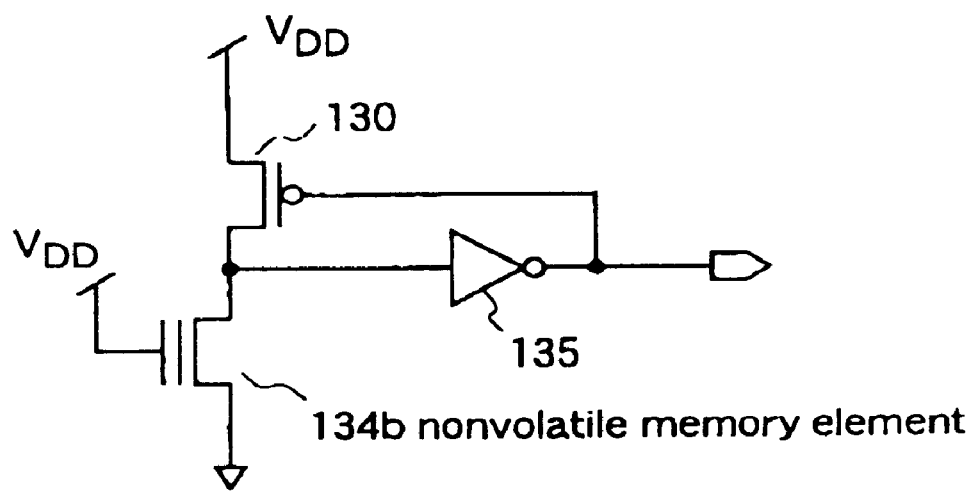
FIG. 14 is a circuit diagram illustrating a variation of the data holding circuit in the register unit of the semiconductor memory according to the first embodiment.

FIG. 14 is a circuit diagram illustrating another example of the data holding circuits 120a~120f in the register unit 4 as shown in FIG. 12. In FIG. 14, the fuse element 134a which contains the data in the data holding circuit as shown in FIG. 13 is replaced with a nonvolatile memory element 134b. In this figure, the same reference numerals as those in FIG. 13 denote the same or corresponding parts. In this data holding circuit, instead of disconnecting the fuse element, changing the charge which is held by the nonvolatile memory element 134b turns the memory element on or off. Other construction is the same as that of the data holding circuit as shown in FIG. 13.

Here, any unit can be employed as the data holding circuits 120a~120f as long as the unit can hold 1-bit data and output the data.

Figure 2:
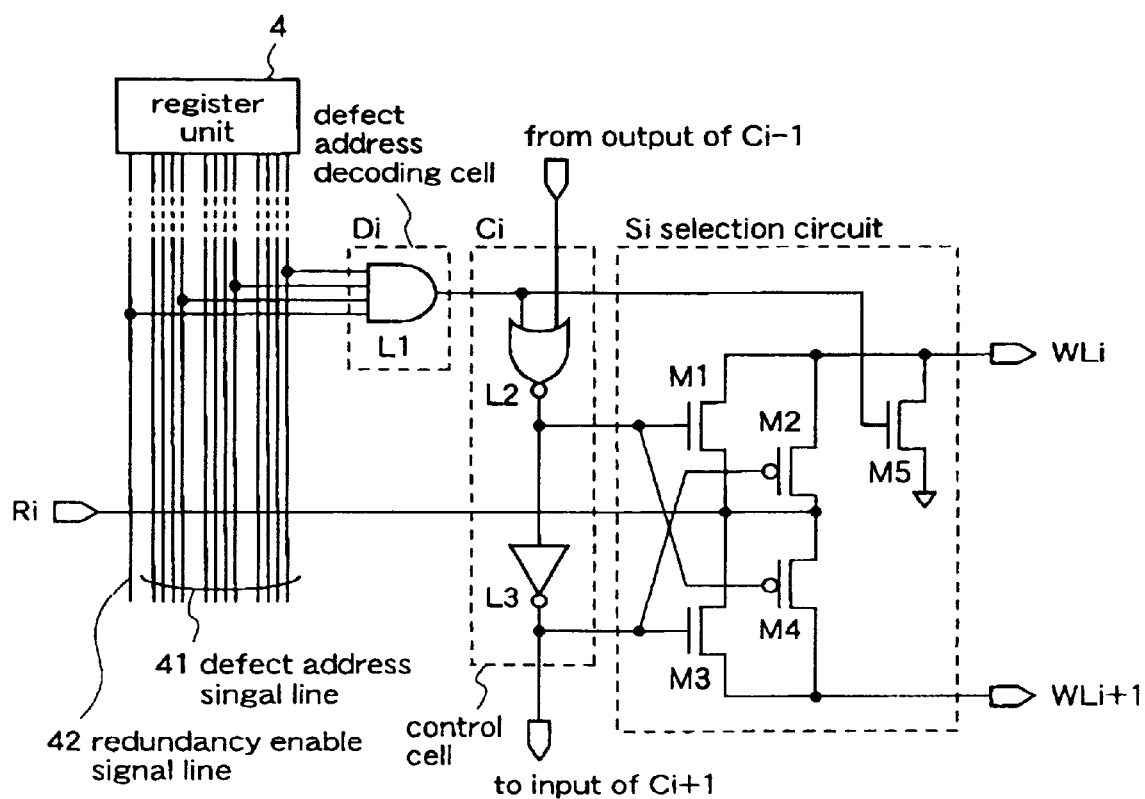
FIG. 2 is a circuit diagram for explaining a redundancy control circuit in the semiconductor memory according to the first embodiment.

FIG. 2 is a circuit diagram illustrating a structure of the major part of the redundancy control circuit 3 as shown in FIG. 1. In FIG. 2, the same reference numerals as those in FIG. 1 denote the same or corresponding parts. Here, the structures of the defect address decoding cell Di, the control cell Ci, and the selection circuit Si, corresponding to the i-th output signal line Ri of the row decoder 2 will be described.

The register unit 4 outputs the pre-decoded defect address and a redundancy enable signal through a defect address signal line 41 comprising three sets of 2-bit signals, i.e., 6 bit in total, and an 1-bit redundancy enable signal line 42, respectively. The redundancy enable signal is a signal for preventing the defect address decoding cells D1~Dn from operating when the replacement of memory cells is not performed. When there is a defective word line and the defect address specifies the address of the word line, the redundancy enable signal is "1". When there is no defect and no defect address is specified, the redundancy enable signal is "0". An And circuit L1 constitutes the defect address decoding cell Di. The redundancy enable signal sent through the redundancy enable signal line 42 and three signals which are obtained by extracting one of the 2-bit signals from each of the three sets, sent through the defect address signal line 41 are input to the AND circuit L1. The combinations of the signals extracted from the defect address signal line 41 vary with the defect address decoders D1~Dn. The control cell Ci is constituted by a NOR circuit L2 and an inverter circuit L3. N-type MOS transistors M1, M3 and M5, and P-type MOS transistors M2 and M4 constitute the selection circuit Si. The N-type MOS transistor M1 and the P-type MOS transistor M2 constitutes switches between the output of the signal line Ri of the row decoder and the word line WLi. Similarly, the N-type MOS transistor M3 and the P-type MOS transistor M4 constitute switches between the output of the signal line Ri of the row decoder and the word line WLi+1. The N-type MOS transistor M5 has a function of fixing the word line WLi to the ground potential. Here, while there are three control signal lines from the control cell Ci to the selection circuit Si, the output of the control cell particularly refers to the output from the inverter circuit L3 in the following description.

Hereinafter, the operation of the semiconductor memory according to the first embodiment having the above-described structure will be described. The row decoder 2 decodes an input row address, and outputs a decoded result to the signal lines R1~Rn. The selection circuits S1~Sn receive the outputs of the control cells C1~Cn, and switch the connections between the signal lines R1~Rn of the row decoder 2 and the word lines WL1~WLn+1, respectively. The defect address decoder 31 decodes the defect address which is received from the register unit 4, and outputs whether the respective word lines are good or not to the control cells C1~Cn, respectively.

When the output of the control cell Ci is "L" (Low level), the i-th selection circuit Si selects the word line WLi, and when the output is "H" (High level), the selection circuit Si selects the word lines WLi+1. The defect address decoding cell Di receives the defect address from the register unit 4, and when the word line WLi has a defect, the defect address decoding cell Di outputs "H" and when the word line WLi has no defect, the defect address decoding cell Di outputs "L". The control cell Ci outputs "H" when the defect information input by the defect address decoding cell Di indicates that WLi has a defect or the output of Ci−1 is "H", and the control cell Ci outputs "L" in other cases.

For example when there is a defective memory cell MC in the word line WLi, the defect address corresponding to the word line WLi is set in the register unit 4. This defect address is decoded by the defect address decoder 31 and whether each of the word lines is good or not is output.

To the control cells C1~Ci−1, "L" is respectively input by the defect address decoding cells D1~Di−1 as well as "L" is respectively input also by their previous and adjacent control cells. Consequently, the control cells C1~Ci−1 output "L", respectively.

Since the defect address decoding cell Di decodes the defect address and outputs "H" and the control cell Ci−1 outputs "L", the control cell Ci outputs "H".

To the control cells Ci+1~Cn, "L" is respectively input by the defect address decoding cells Di+1~Dn, and "H" is respectively input by their previous and adjacent control cells. Consequently, the control cells C1~Ci−1 output "L" and the control cells Ci+1~Cn output "H", respectively. Accordingly, as for k satisfying the relationship 1≦k≦i, the selection circuit Sk is controlled to select the word line WLk for the output signal line Rk, and as for j satisfying the relationship i≦j≦n, the selection circuit Sj is controlled to select the word line WLj+1 for the output signal line Rj. That is, the redundancy control circuit 3 replaces defective memory cells with redundant memory cells by shifting the connections of the i-th and subsequent selection circuits so as to skip the defective word line WLi as shown in FIG. 1.

Here, the control cell Cn+1 and the selection circuit Sn+1 have functions of fixing the spare word line WLn+1 to the ground potential GND when the replacement of defective memory cells is not performed.

As described above, in the semiconductor memory according to this first embodiment, the encoded address indicating the defective word line is stored in the register unit 4, this defect address is decoded by the defect address decoder 31, whether the respective word lines are good or not is output, and the defective memory cells are replaced with redundant memory cells on the basis of the result. Therefore, it is not required to provide the fuse element or memory cell in each control cell, whereby the area can be reduced.

In addition, the encoded defect address is stored in the register unit 4 as the defect information. Therefore, the required amount of data as the defect information is decreased and the time for writing the defect information can be reduced.

Further, each of the outputs of the row decoder and each of the word lines are connected via one switching element. Therefore, the load on the circuit operation is reduced, whereby the higher-speed operation is realized.

In this first embodiment, a register unit having a structure other than the structure which is described with reference to FIG. 12 can be employed, as long as that register unit can hold an encoded defect address and output the address.

In addition, in this first embodiment, the defect address is encoded into 6 bits. However, as long as the address is encoded, any number of bits other than 6 bits can be used. This number of bits can be changed according to the number of word lines of the memory cell array 1 or the like.

Further, in this first embodiment, the defective memory cells are replaced with the redundant memory cells in rows. However, the defective memory cells can be replaced with the redundant memory cells in columns by a similar structure.

When the memory cell array 1 is examined, the spare word line WLn+1 should be also examined in addition to the normal word lines WL1~WLn. At the time of the examination of the spare word line WLn+1, when the register unit 4 outputs the defect address specifying the word line WL1, the connections of all the selection circuits are shifted and thereby the spare word line WLn+1 is selected.

The operation such as reading, erasure, and writing for the memory cells on the spare word line WLn+1 at the time of the examination can also be realized by switching the input of the control cell C1 from the ground potential GND ("L") to the power supply voltage VDD ("H").

Though not shown, but when the semiconductor memory of the first embodiment has a structure in which outputs of the signal lines R1~Rn+1 are output from the row decoder 2, the input to the selection circuit Sn+1 is switched from the ground potential GND to the output of the signal line Rn+1 of the row decoder, and the output of the signal line Rn+1 of the row decoder is used in a mode for operating all the memory cells in the memory cell array 1, all of the word lines can be successively selected using a row address in a case where all the memory cells are to be operated, such as at the time of examination. Therefore, the operation of the word lines at the time of the examination and the like is facilitated.

Figure 3:
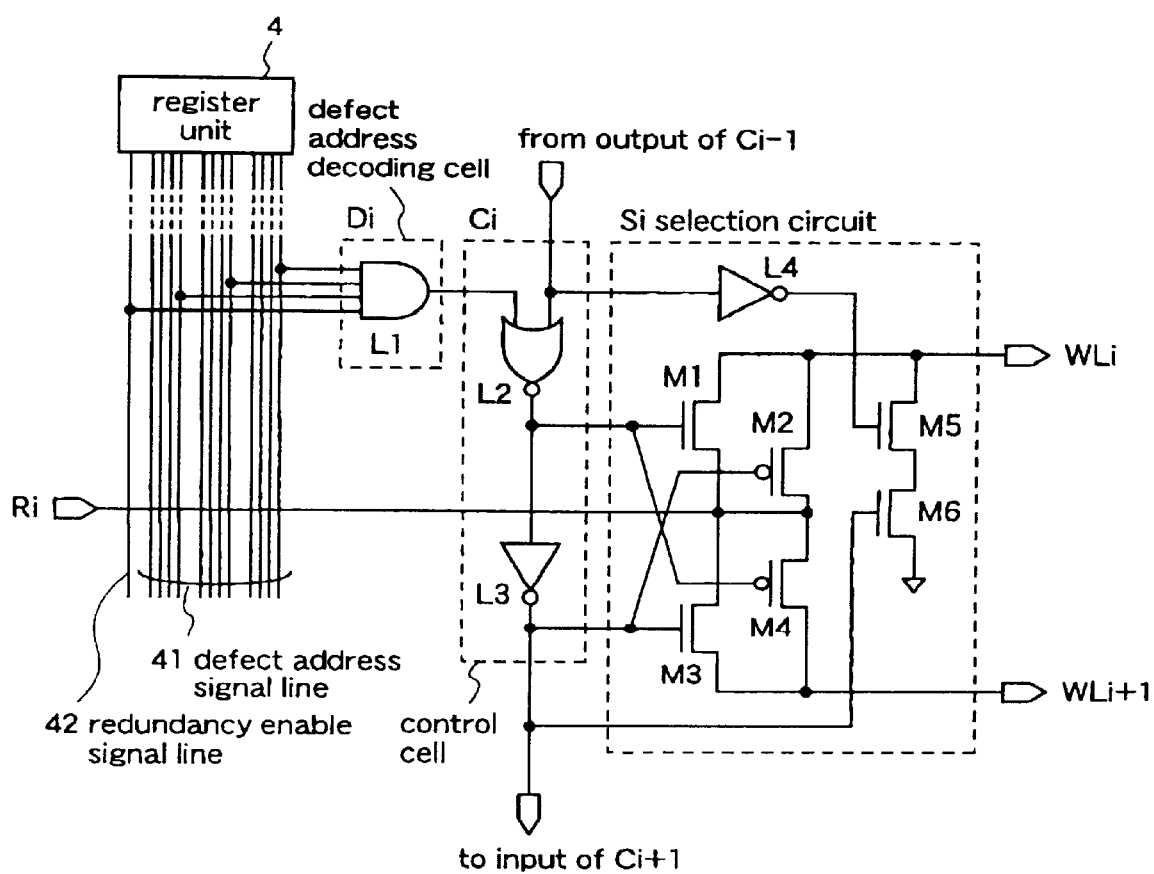
FIG. 3 is a circuit diagram illustrating a variation of the redundancy control circuit in the semiconductor memory according to the first embodiment.

FIG. 3 is a circuit diagram for explaining variations of the control cell Ci and the selection circuit Si in the semiconductor memory according to the first embodiment. In FIG. 3, the same reference numerals as those in the FIGS. 1 and 2 denote elements having the same functions. In this figure, L1 denotes an AND circuit, and the AND circuit L1 constitutes the defect address decoding cell Di. L2 denotes a NOR circuit and L3 denotes an inverter circuit. This NOR circuit L2 and the inverter circuit L3 constitute the control cell Ci. M1, M3, M5 and M6 denote N-type MOS transistors, and M2 and M4 denote P-type MOS transistors. L4 denotes an inverter circuit. The transistors M1~M6 and the inverter circuit L4 constitute the selection circuit Si. The N-type MOS transistor M1 and the P-type MOS transistor M2 constitute switches between the output of the signal line Ri of the row decoder and the word line WLi. Similarly, the N-type MOS transistor M3 and the P-type MOS transistor M4 constitute switches between the output of the signal line Ri of the row decoder and the word line WLi+1. The N-type MOS transistors M5 and M6 have functions of fixing the word line WLi to the ground potential. Numeral 41 denotes a defect address signal line. The defect address signal line 41 sends the defect address which is output by the register unit to the defect address decoder 31. Numeral 42 denotes a redundancy enable signal line. The redundancy enable signal line 42 sends a redundancy control enable signal.

Hereinafter, the description is given of only a difference between the control cell Ci and the selection circuit Si shown in FIG. 3 and those described with reference to FIG. 2.

The difference of the redundancy control circuit between the first example and the variation is a circuit part for fixing the defective word line to the ground potential. In FIG. 3, the N-type MOS transistors M5 and M6 are controlled using the input signal to the control cell Ci and the output signal of the control cell Ci, respectively, instead of the output signal of the defect address decoding cell Di. In this variation, the same effects as those of the first example can be obtained.

[Embodiment 2]

Figure 4:
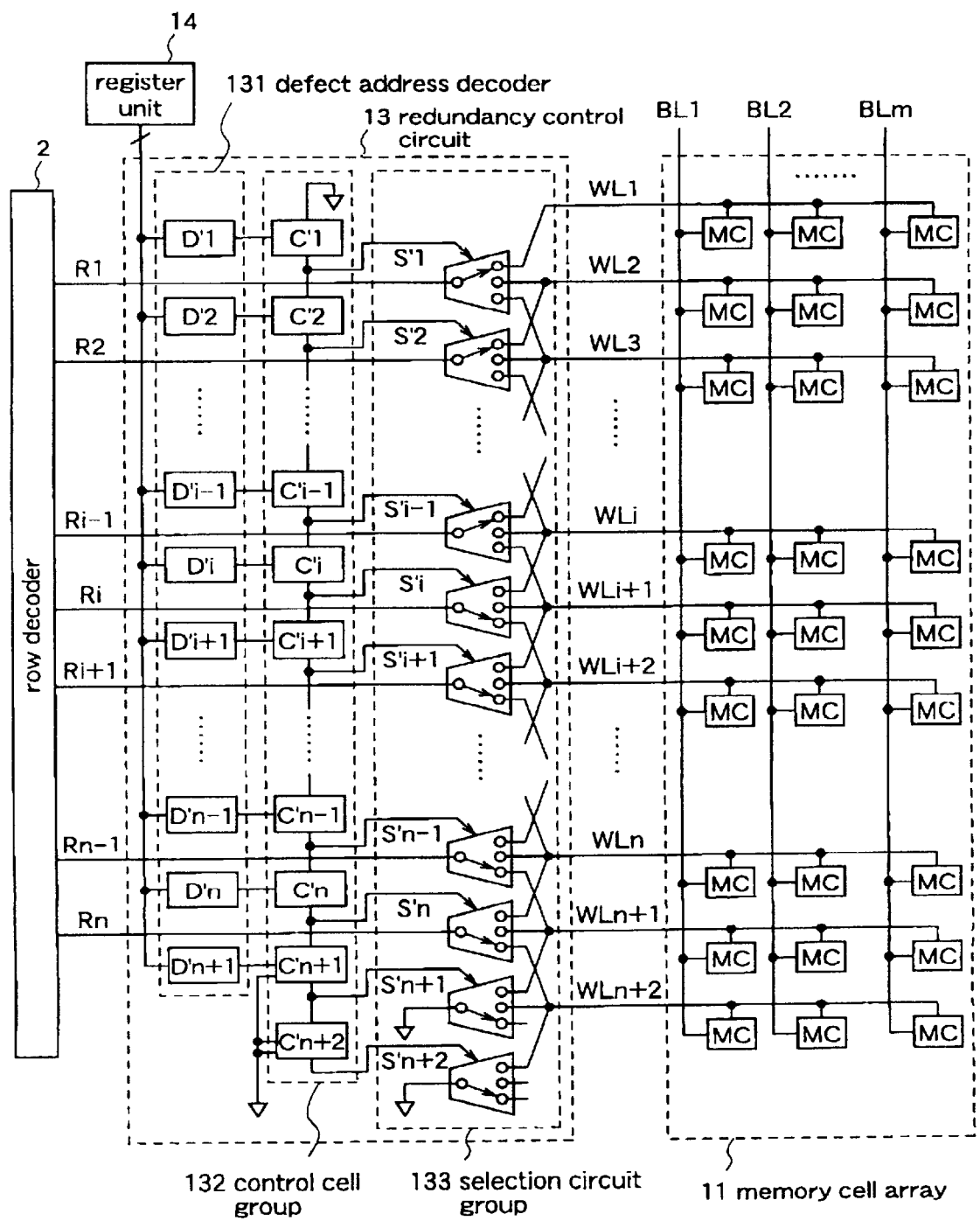
FIG. 4 is a circuit diagram illustrating a semiconductor memory according to a second embodiment of the present invention.

FIG. 4 is a circuit diagram illustrating a structure of a semiconductor memory according to a second embodiment of the present invention. The semiconductor of the second embodiment includes two spare word lines in the memory cell array of the semiconductor memory according to the first embodiment, thereby enabling to replace the defective memory cells in up to two word lines with redundant memory cells.

In FIG. 4, the same reference numerals as those in FIG. 1 denote elements having the same functions as those in the first embodiment. In this figure, a memory cell array 11 has memory cells MC which are connected to word lines WL1~WLn+2 and bit lines BL1~BLm, and arranged like a matrix. A row decoder 2 decodes an input row address and outputs a decoded result to signal lines R1~Rn. A redundancy control circuit 13 controls connections between the signal lines R1~Rn and the word lines WL1~WLn+2. A register unit 14 holds defect information of up to two word lines.

In the redundancy control circuit 13, a defect address decoder 131 comprises defect address decoding cells D1'~D'n+1. The defect address decoding cells D'1–D'n+1 output the state "1" when the corresponding word lines WL1~WLn have defects, and output the state "0" when the corresponding word lines WL1~WLn have no defect, respectively. Selection circuits S'1~S'n+2 constituting a selection circuit group 133 are respectively connected to an output of the row decoder 2 and three word lines which are arranged successively, and switch connections between the output signal lines R1~Rn of the row decoder 2 and the corresponding word lines WL1~WLn+2, respectively. Control cells C'1~C'n+2 are connected to the selection circuits S'1~S'n+2, respectively, and successively connected each other according to the arrangement orders of the corresponding word lines. The control cells C'1~C'n+1 are connected to the outputs of the defect address decoders, respectively, and output one of three states, i.e., "0", "1" and "2" to control the selection circuits S'1~S'n+1, respectively.

Figure 8:
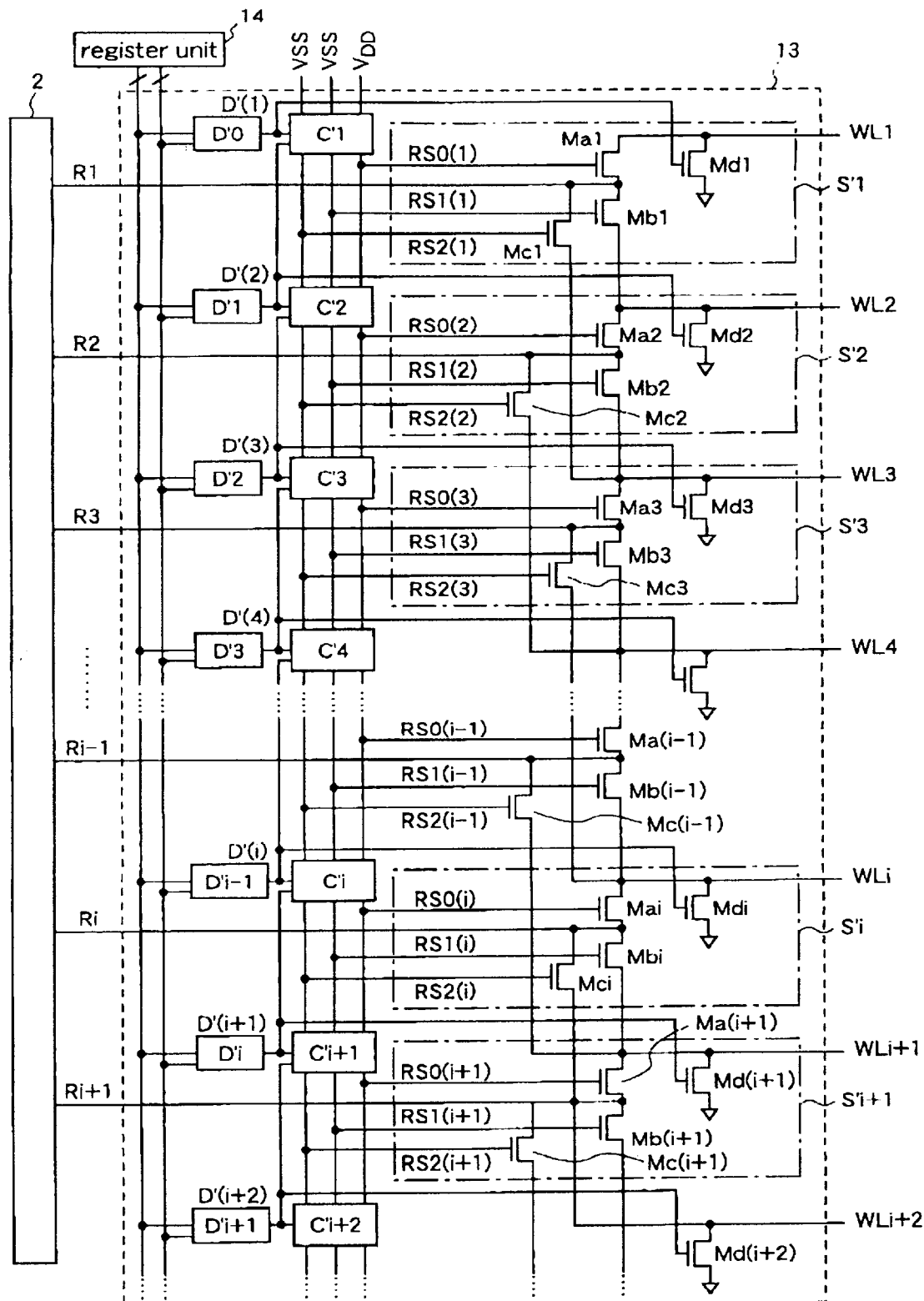
FIG. 8 is a circuit diagram illustrating a redundancy control circuit in the semiconductor memory according to the second embodiment.

FIG. 8 is a circuit diagram specifically illustrating a structure of the redundancy control circuit 13 of the semiconductor memory according to the second embodiment. In FIG. 8, the same reference numerals as those in FIG. 4 denotes the same or corresponding parts. In this figure, internal structures of the selection circuits are partly simplified. The selection circuits S'1~S'n+2 each comprise N-type MOS transistors Ma, Mb and Mc each having a gate for receiving a signal input by corresponding one of the control cells C'1~C'n+2, and a N-type MOS transistor Md having a gate for receiving an output of corresponding one of the defect address decoding cells D'1~D'n. The register unit 14 holds two defect addresses for specifying two defective word lines, and outputs these defect addresses and the redundancy enable signal to the defect address decoding cells D'1~D'n+1 via defect address signal lines 41a and 41b and redundancy enable signal lines 42a and 42b, respectively. A register unit including two units which have the same structure as that of the register unit 4 of the first embodiment, in parallel is used as this register unit 14. In this case, the register unit 14 can output two 6-bit defect addresses.

Figure 10:
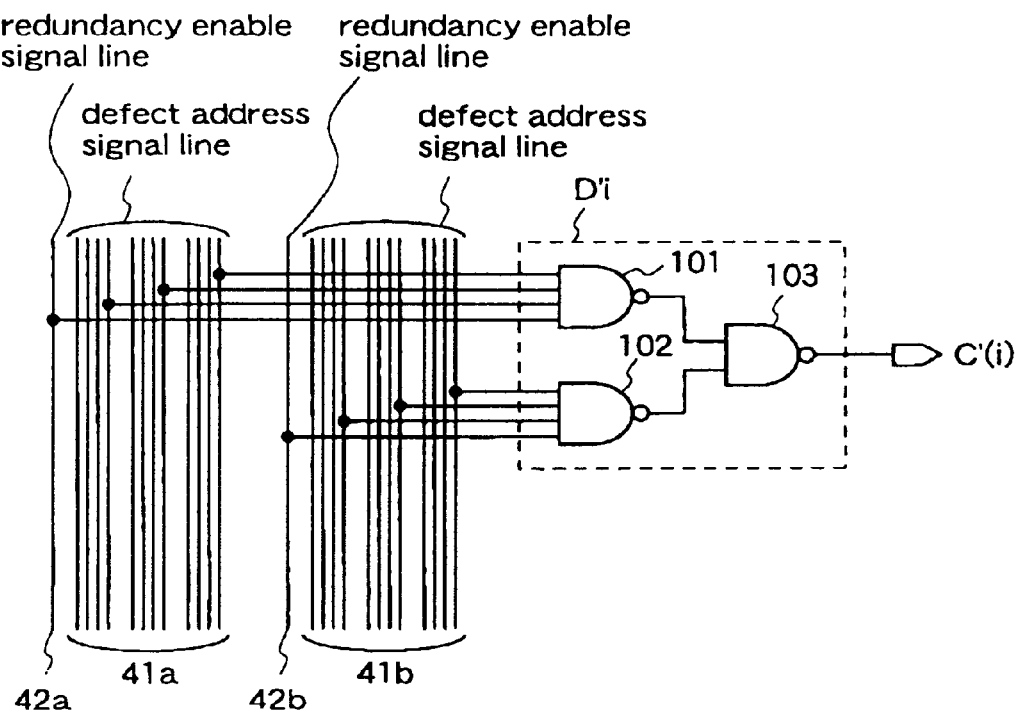
FIG. 10 is a circuit diagram illustrating a defect address decoding cell in the semiconductor memory according to the second embodiment.

FIG. 10 is a circuit diagram illustrating a detailed structure of the i-th defect address decoding cell D'i in the redundancy control circuit 13 as shown in FIG. 8. In this figure, the same reference numerals as those in FIG. 8 denote the same or corresponding parts. Here, assume that the register unit 14 outputs pre-decoded defect addresses and redundancy enable signals through the defect address signal lines 41a and 41b each comprising three sets of 2-bit signals, i.e., 6 bit in total and 1-bit redundancy enable signal lines 42a and 42b, respectively. In this case, the redundancy enable signal output through the redundancy enable signal line 42a and three signals which are obtained by extracting one of the 2-bit signals from each of the three sets, sent through the defect address signal line 41a are input to a NAND circuit 101. The combinations of the signals extracted through the defect address signal line 41a vary with the defect address decoding cells D'1~D'n+1. Similarly, the redundancy enable signal output through the redundancy enable signal line 42b and three signals which are obtained by extracting one of the 2-bit signals from each of the three sets, sent through the defect address signal line 41b are input to a NAND circuit 102. The NAND circuits 101 and 102 respectively output "0" only when the defect addresses which are input through the defect address signal lines 41a and 41b show that the word line WLi has a defect. A NAND circuit 103 outputs "1" to the control cell C'i when at least one of the NAND circuits 101 and 102 outputs "0".

Figure 9:
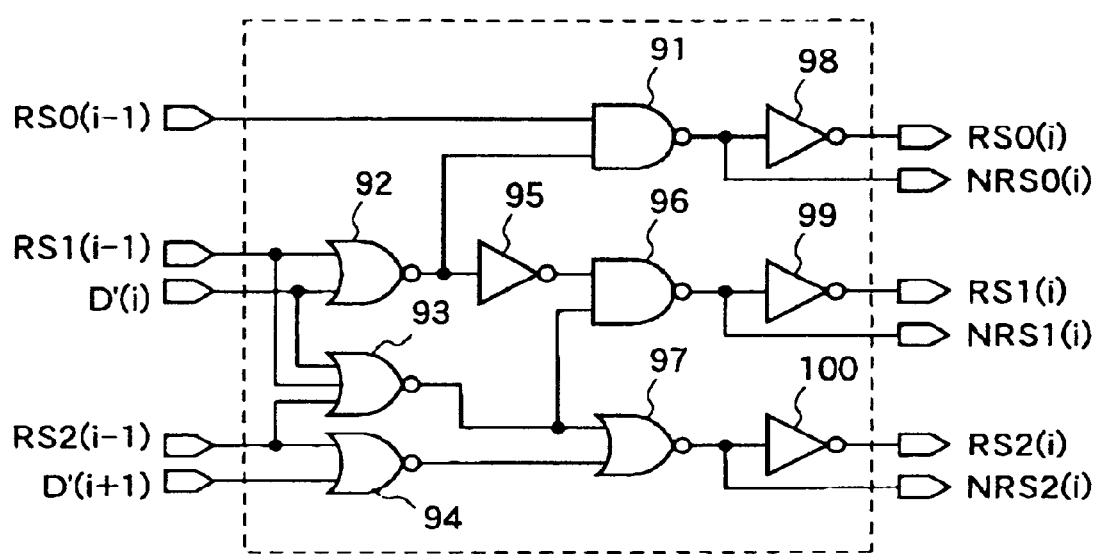
FIG. 9 is a circuit diagram illustrating a control cell in the semiconductor memory according to the second embodiment.

FIG. 9 is a circuit diagram illustrating a detailed structure of the i-th control cell C'i in the redundancy control circuit 13 shown in FIG. 8. In this figure, the same reference numerals as those in FIG. 8 denote the same or corresponding parts. A NAND circuit 91 receives a signal RS0(i−1) as one of signals which are input by the control cell C'(i−1) connected just before C'i and an output of a NOR circuit 92, and outputs NRS0(i) and RS0(i) which is obtained by inverting NRS0(i) with an inverter 98 to the control cell C'(i+1) connected just after C'i. The NOR circuit 92 receives the output of the defect address decoding cell D'i and a signal RS1(i−1) as one of signals which are input by the control cell C'(i−1) connected just before C'i, and inputs a signal which is obtained by inverting its output with an inverter 95 to a NAND circuit 96. The NAND circuit 96 receives the signal which is input by the inverter 95 connected just before the circuit 96 and an output of a NOR circuit 93, and outputs NRS1(i) and RS1(i) which is obtained by inverting NRS1(i) with an inverter 99 to the control cell C'(i+1) connected just after C'(i). The NOR circuit 93 receives the signals RS1(i−1) and RS2(i−1) among the signals which are input by the control cell C'(i−1) connected just before C'i, and the output of the defect address decoding cell D'i. A NOR circuit 94 receives the signal RS2(i−1) among the signals which are input by the control cell C'(i−1) connected just before C'i and the output of the defect address decoding cell D'i+1. A NOR circuit 97 receives outputs from the NOR circuits 93 and 94, and outputs RS2(i) and NRS2(i) which is obtained by inverting RS2(i) with an inverter 100 to the control cell C'(i+1) connected just after C'i.

Figure 11:
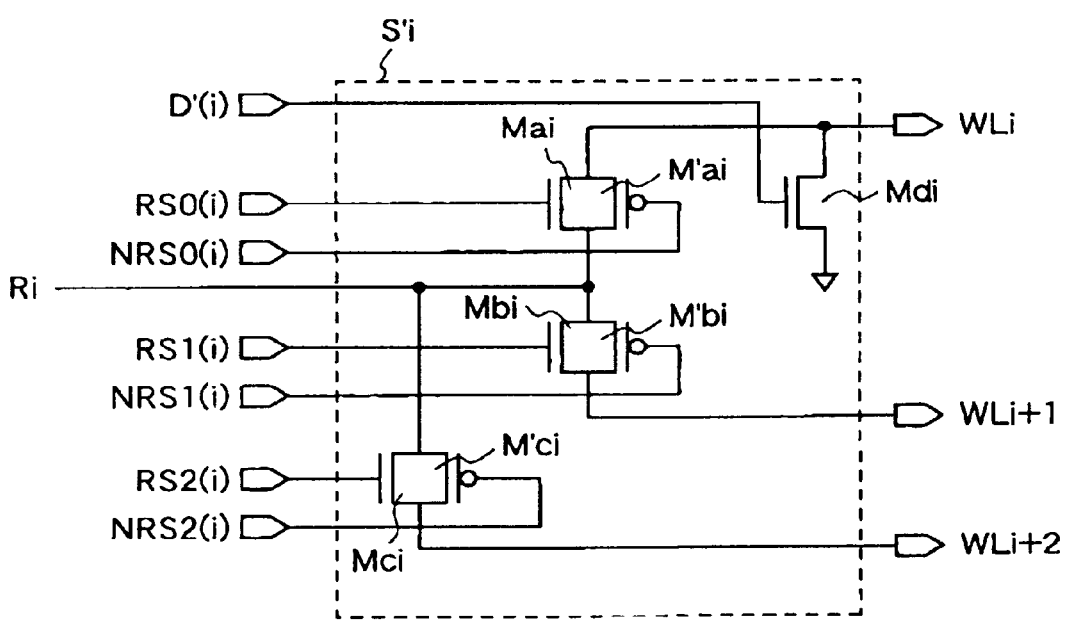
FIG. 11 is a circuit diagram illustrating a selection circuit in the semiconductor memory according to the second embodiment.

FIG. 11 is a circuit diagram illustrating a detailed structure of the i-th selection circuit S'i in the redundancy control circuit 13 shown in FIG. 8. In this figure, the same reference numerals as those in FIG. 8 denote the same or corresponding parts. N-type MOS transistors Mai, Mbi and Mci, and P-type MOS transistors M'ai, M'bi and M'ci are provided in pair in the selection circuit S'i. The signals RS0, RS1 and RS2 from the control cell C'i are input to gates of the N-type MOS transistors Mai, Mbi and Mci, respectively. The inverted signals of RS0, RS1 and RS2, i.e., NRS0, NRS1 and NRS2 from the control cell C'i are input to gates of the P-type MOS transistors M'ai, M'bi and M'ci, respectively. The pair of the transistors Mai and M'ai constitute a switch between the output signal line Ri and the word line WLi. The pair of the transistors Mbi and M'bi constitute a switch between the output signal line Ri and the word line WLi+1. The pair of the transistors Mci and M'ci constitute a switch between the output signal line Ri and the word line WLi+2. An N-type MOS transistor Mdi has a function of fixing the word line WLi to the ground potential. The output of the defect address decoding cell D'i is input to the gate of the N-type MOS transistor Mdi.

Hereinafter, the operation of the so-constructed semiconductor memory according to the second embodiment will be described. The row decoder 2 decodes an input row address and outputs a decoded result to the signal lines R1~Rn. The selection circuits S'i~S'n receive the outputs of the control cells C'1~C'n, and switch the connections between the signal lines R1~Rn of the row decoder 2 and the word lines WL1~WLn+2. The defect address decoder 131 decodes the defect addresses which are received from the register unit 14, and outputs whether the respective word lines are good or not to the control cells C'1–C'n+1, respectively. When the output of the control cell C'i is the state "0", the i-th selection circuit S'i selects the word line WLi. When the output of the control cell C'i is the state "1", the i-th selection circuit S'i selects the word line WLi+1. When the output of the control cell C'i is the state "2", the i-th selection circuit S'i selects the word line WLi+2. The defect address decoding cell D'i receives the defect addresses from the register unit 14, and outputs "1" when the word line WLi has a defect and outputs "0" when the word line WLi has no defect. When the inputs from the defect address decoding cells D'i and D'i+1 satisfy the relationship {D'i, D'i+1}={"0", "0"}, the control cell C'i outputs the state received from the control cell C'i−1 as it is. When the inputs from the defect address decoding cells D'i and D'i+1 satisfy the relationship {D'i, D'i+1}={"1", "0"}, the control cell C'i outputs the state "1" when the output of the control cell C'i−1 is the state "0". When the inputs from the defect address decoding cells D'i and D'i+1 satisfy the relationship {D'i, D'i+1}={"0", "1"}, the control cell C'i outputs the state "0" when the output of the control cell C'i−1 is the state "0", and the state "2" when the output of the control cell C'i−1 is the state "1". When the inputs from the defect address decoding cells D'i and D'i+1 satisfy the relationship {D'i, D'i+1}={"1", "1"}, the control cell C'i outputs the state "2" when the output of the control cell C'i−1 is the state "0". Accordingly, like the first embodiment, the connections of the selection circuits are shifted so as to skip up to two defective word lines, the word lines except the defective word lines are connected with the output signal lines R1~Rn of the row decoder 2 successively according to the arrangement orders, and thereby the defective memory cells are replaced with redundant memory cells using the spare word lines.

In this case, the control cells C'n+1 and C'n+2 and the selection circuits S'n+1 and S'n+2 have functions of fixing the spare word lines WLn+1 or WLn+2 which is not being used for replacing the defective memory cell with the redundant memory cell, to the ground potential.

When the word line WLn+1 has a defect in a case where one row in the normal word lines WL1—WLn has a defect, this defect is avoided, and the control cell C'n−1 outputs the state "1", the output of the signal line Rn of the row decoder 2 cannot be connected to WLn+1. Therefore, the defect address decoding cell D'n+1 is provided to specify that the word line WLn+1 has a defect, make the control cell C'n output the state "2", and connect the output of the signal line Rn of the row decoder 2 to the word line WLn+2.

As described above, according to this second embodiment, the defective memory cells in up to two defective word lines can be replaced with the redundant memory cells. The register unit 14 holds up to two defect addresses, and the defect address decoder 131 outputs whether the respective word lines are good or not. Therefore, it is not required to provide the fuse element or memory cell in each control cell, whereby the area can be reduced.

It goes without saying that the register unit 14 in the semiconductor memory according to the second embodiment can internally have a fuse element or nonvolatile memory cell to contain the defect addresses, like the first embodiment.

Further, while the defective memory cells are replaced with the redundant memory cells in rows in this second embodiment, the defective memory cells can be replaced with the redundant memory cells in columns using a similar structure.

When the memory cell array 1 is examined, the spare word lines WLn+1 and WLn+2 should be also examined in addition to the normal word lines WL1~WLn. When the register unit 14 outputs two addresses of the word lines WL1 and WL2 at the time of the examination of the spare word lines WLn+1 and WLn+2, the connections of all the selection circuits are shifted, whereby the spare word lines WLn+1 and WLn+2 are selected.

The operation such as reading, erasure, and writing for the memory cells on the spare word lines WLn+1 and WLn+2 at the time of the examination are also realized by, instead of inputting the ground potential to the control cell C'1, providing a means such as a logical circuit for outputting the state "0" in normal times, and when the spare row line is to be accessed such as at the examination, outputting the state "2" in accordance with a control signal and inputting the output of this means to the control cell C'1, thereby switching the input to the control cell C'1 from the state "0" to the state "2".

When outputs of the signal lines R1~Rn+2 are output from the row decoder 2, the inputs to the selection circuits S'n+1 and S'n+2 are changed from the ground potential GND to the outputs of the signal lines Rn+1 and Rn+2 of the row decoder, respectively, and the spare word lines WLn+1 and WLn+2 can be selected using the outputs of the signal lines Rn+1 and Rn+2 of the row decoder in a mode for operating all the memory cells in the memory cell array 11, the spare word lines can be selected successively using the row address in a case where all the memory cells are to be operated, such as at the examination. Therefore, the operation at the time of the examination is facilitated.

In this second embodiment, the defective memory cells in up to two defective word lines are replaced with the redundant memory cells. However, when the number of spare word lines, the number of defect address decoding cells for inputting signals to control cells, the number of states output by the control cells, the number of word lines which are successively arranged and connected by the selection circuits and the like are increased, the defective memory cells in three or more defective word lines can be also replaced with the redundant memory cells using a similar structure.

[Embodiment 3]

Figure 5:
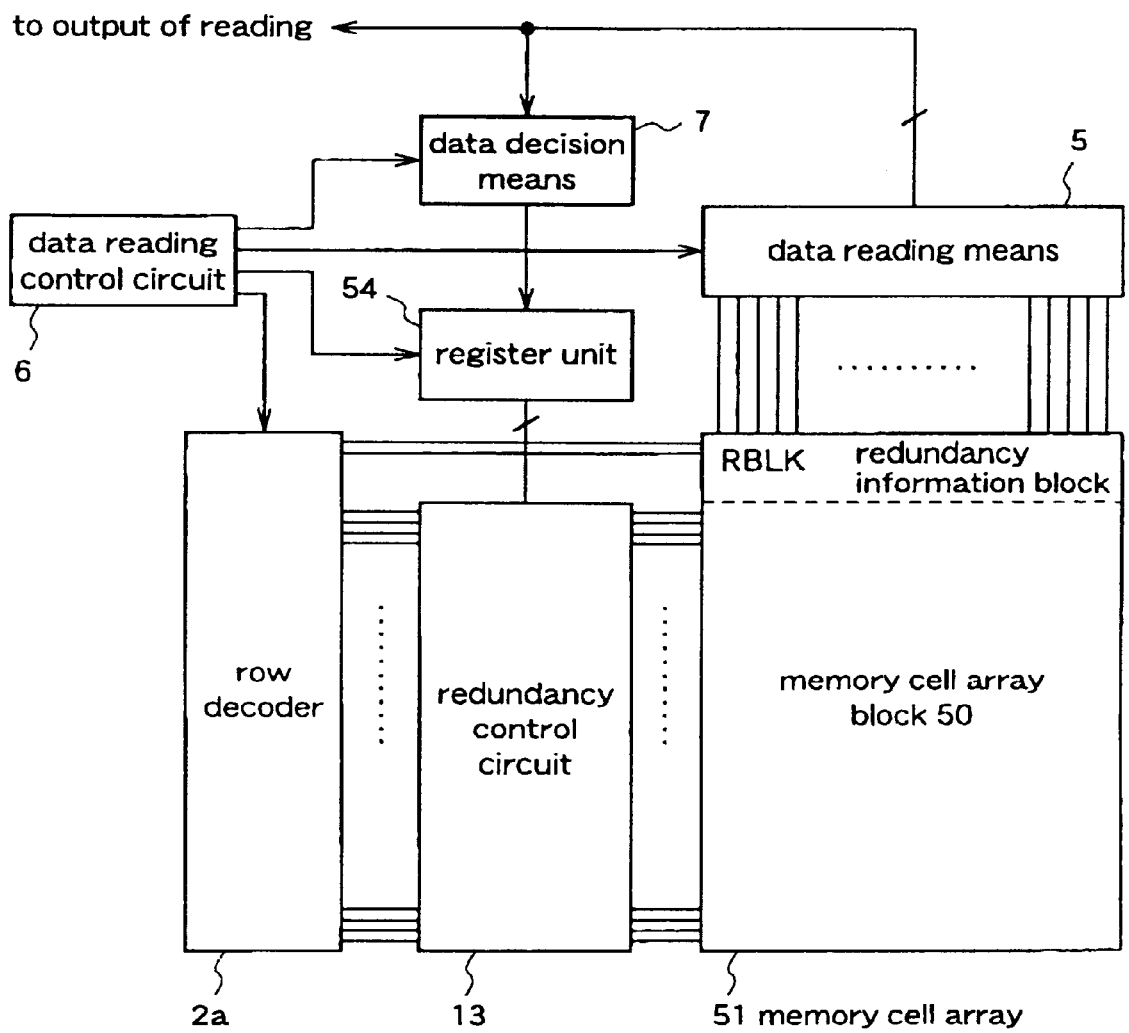
FIG. 5 is a block diagram illustrating a semiconductor memory according to a third embodiment of the present invention.

FIG. 5 is a block diagram illustrating a semiconductor memory according to a third embodiment of the present invention. In this figure, the same reference numerals as those in FIG. 4 denote the same or corresponding parts. In FIG. 5, a memory cell array 51 comprises a redundancy information block RBLK and a memory 6 cell array block 50. The memory cell array block 50 has the same structure as that of the memory cell array 11 in the second embodiment. The redundancy information block RBLK comprises nonvolatile memory cells which are arranged like a matrix. The redundancy information block RBLK contain redundancy information which includes an encoded defect address indicating a defective word line. Considering a case where errors occur in data, it is desirable that the redundancy information stored in the redundancy information block RBLK should be redundancy information having a plurality of same defect addresses or redundancy information which is obtained by adding error correction codes for correcting errors to a defect address. A row decoder 2a is the row decoder 2 described in the second embodiment in which a row address is decoded, whereby a memory cell in the redundancy information block RBLK can be selected. A redundancy control circuit 13 replaces the defective memory cells in word lines with redundant memory cells in the memory cell array block 50. A register unit 54 has almost the same structure as that of the register unit 14 in the second embodiment. The register unit 54 is different from the register unit 14 in that the register unit 54 receives and thereafter holds the defect address which is read from the redundancy information block RBLK.

A data reading means 5 comprises a sense amplifier circuit and a column selection circuit, and this means 5 is a circuit for reading the data recorded in the memory cell array 51. A data decision means 7 corrects data received from the data reading means 5 as needed, decides a defect address, and set the defect address in the register unit 54. A data reading control circuit 6 performs control of the whole memory when the redundancy information is read. When the redundancy control is required, i.e., when the memory cell array 51 is to be operated, the data reading control circuit 6 controls the row decoder 2 to select a memory cell in the redundancy information block RBLK, and controls the data decision means 5 to receive the data from the data reading means 5, correct the data as needed, decide the defect address, and thereafter set the defect address in the register unit 54. Then, the defect address is output to the redundancy control circuit 13.

Figure 15:
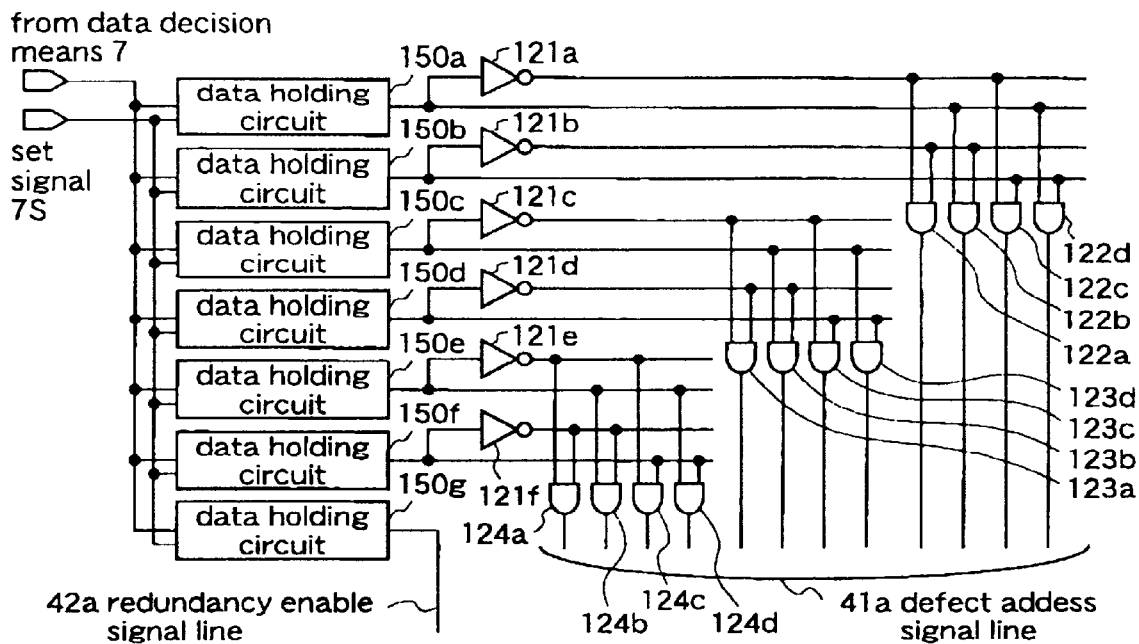
FIGS. 15(a) and 15(b) are circuit diagrams illustrating a register unit of the semiconductor memory according to the third embodiment.
Figure 15:
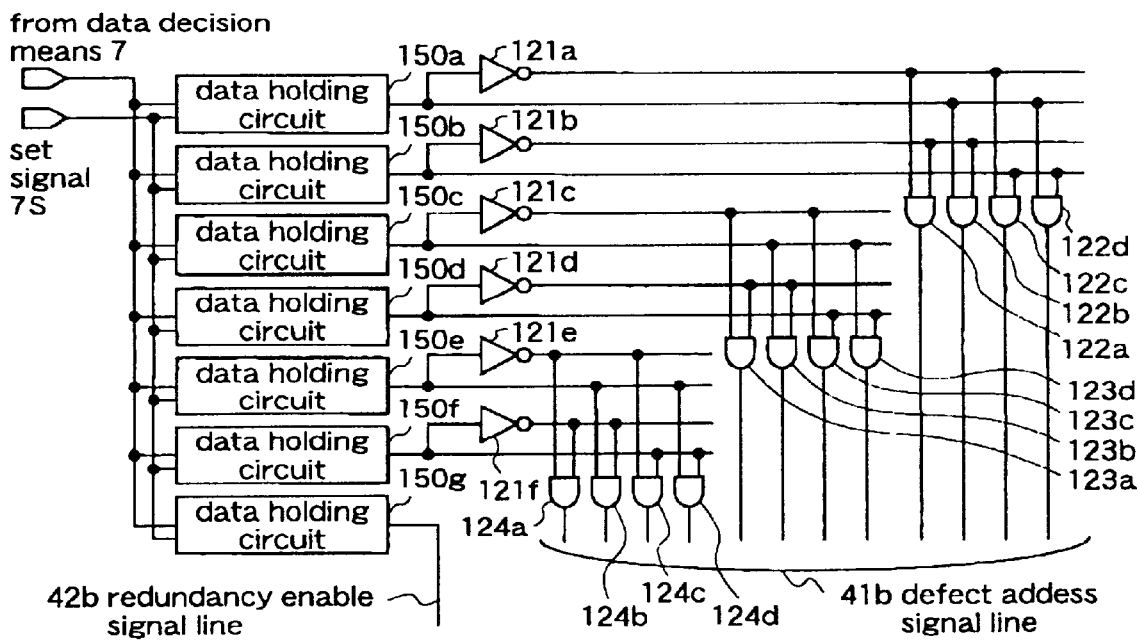
Figure 15:
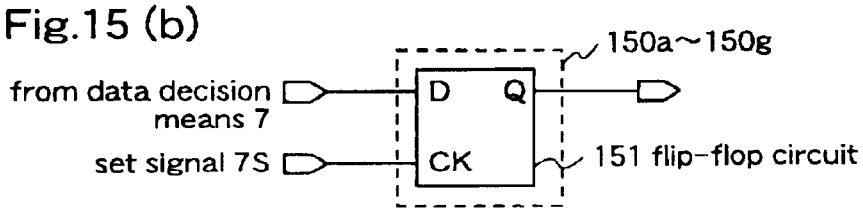

FIG. 15(a) is a diagram illustrating a detailed circuit structure of the register unit 54 according to the third embodiment. FIG. 15(b) is a diagram illustrating a detailed structure of a data holding circuit of the register unit. In these figures, the same reference numerals as those in FIG. 12 denote the same or corresponding parts. In the register unit 54, two of the register unit as described in the first embodiment with reference to FIG. 12 are provided in parallel. The two register units respectively output the outputs through defect address signal lines 41a and 41b and redundancy enable signal lines 42a and 42b, as well as has data holding circuits 150a~150g comprising a flip-flop circuit 151 for receiving and capturing a set signal 7s, thereafter holding a defect address, and outputting the defect address.

Hereinafter, the operation of the so-constructed semiconductor memory according to the third embodiment will be described. The process of setting the redundancy information in the register unit 54 is controlled by the data reading control circuit 6. Initially, the redundancy information is read from the redundancy information block RBLK by the row decoder 2 and the data reading means 5. Then, the redundancy information which is output by the data reading means 5 is input to the data decision means 7, the data is corrected as needed, and then sent to the register unit 54 as the defect address. Subsequently, the defective memory cells in the memory cell array block 50 are replaced with the redundant memory cells by the redundancy control circuit 13 using the defect address held by the register unit 54, like the second embodiment.

As described above, in this third embodiment, the redundancy information block RBLK which contains the redundancy information is provided in the memory cell array 51, and controlled by the same circuitry as that of the memory cell array block 50 as the data area on the memory cell array 51. Therefore, it is unnecessary to provide a circuit for writing/reading data on/from the memory cells containing the redundancy information, separately from a writing circuit or reading circuit of the memory cell array 51. Accordingly, the circuit scale can be reduced and the area can be reduced. Further, also at the time of examination of the memory cells, the redundancy information block RBLK can be examined in the same process as that of the memory cells in the data area, whereby the examination can be simplified.

In addition, the redundancy information having a plurality of the same defect addresses or the redundancy information to which the correction codes are added is recorded in the redundancy information block RBLK, and a corrected defect address is output by the data decision means from read redundancy information. Therefore, even when there is a defect in the redundancy information block which is not replaced with the redundant block by the redundancy control circuit, the defective block can be replaced without problems.

In this third embodiment, the redundancy control circuit 13 which can avoid the defects in up to two word lines as described in the second embodiment is employed. However, defects in one word line, or three or more word lines can be avoided using a redundancy control circuit which can avoid the defects in one word line, or three or more word lines. Also in this case, the same effects as those in the third embodiment can be obtained. For example, the redundancy control circuit which can avoid the defect in one word line as described in the first embodiment can be employed. In this case, only one defect address is held in the redundancy information block. In addition, the register unit 54 holds one defect address and output that address.

In this third embodiment, the register unit can hold the defect address using the flip-flop circuit. However, a register unit having a structure other than that described with reference to FIG. 12 can be employed, as long as the register unit can hold the encoded defect address and output that address.

[Embodiment 4]

Figure 6:
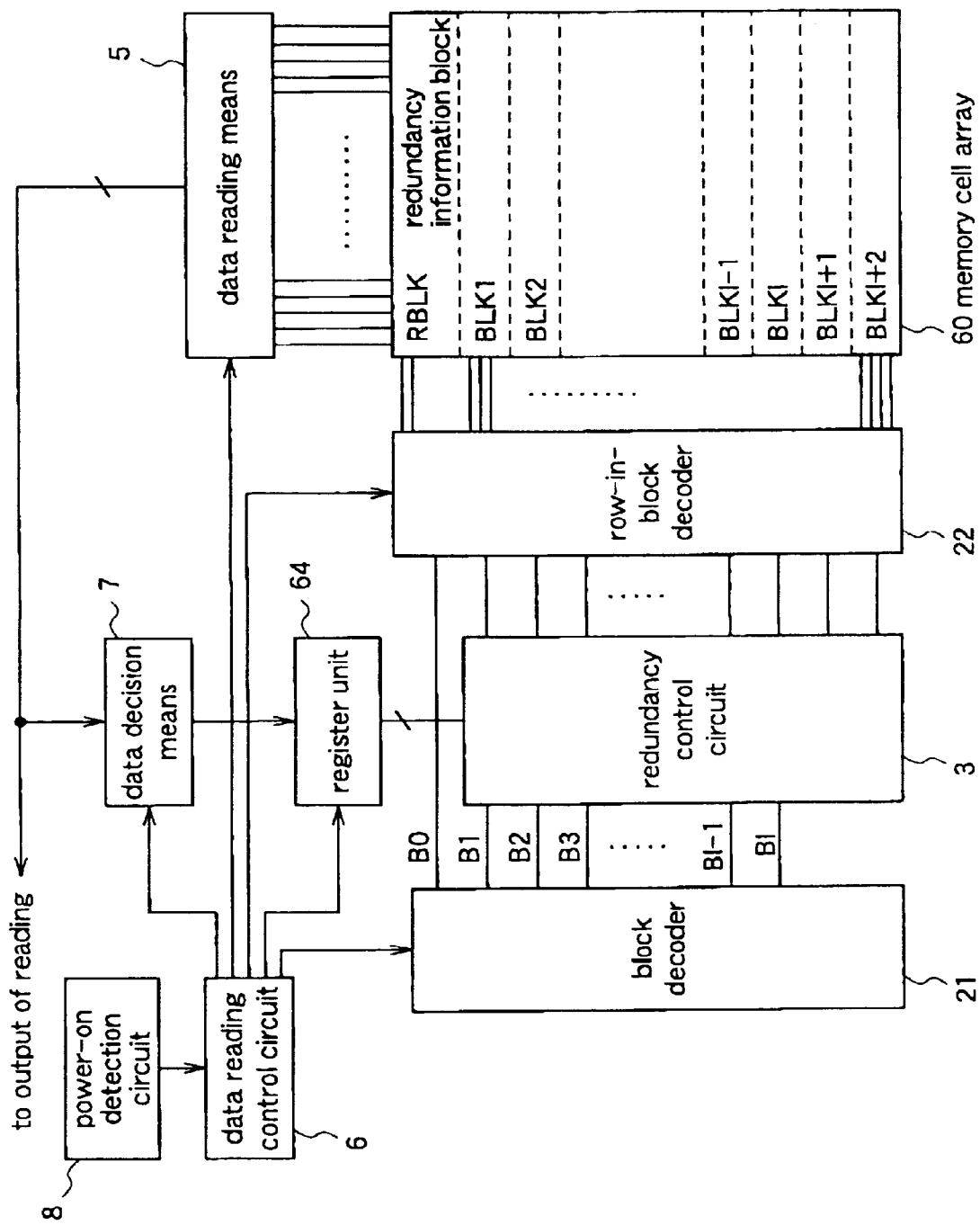
FIG. 6 is a block diagram illustrating a semiconductor memory according to a fourth embodiment of the present invention.
Figure 7:
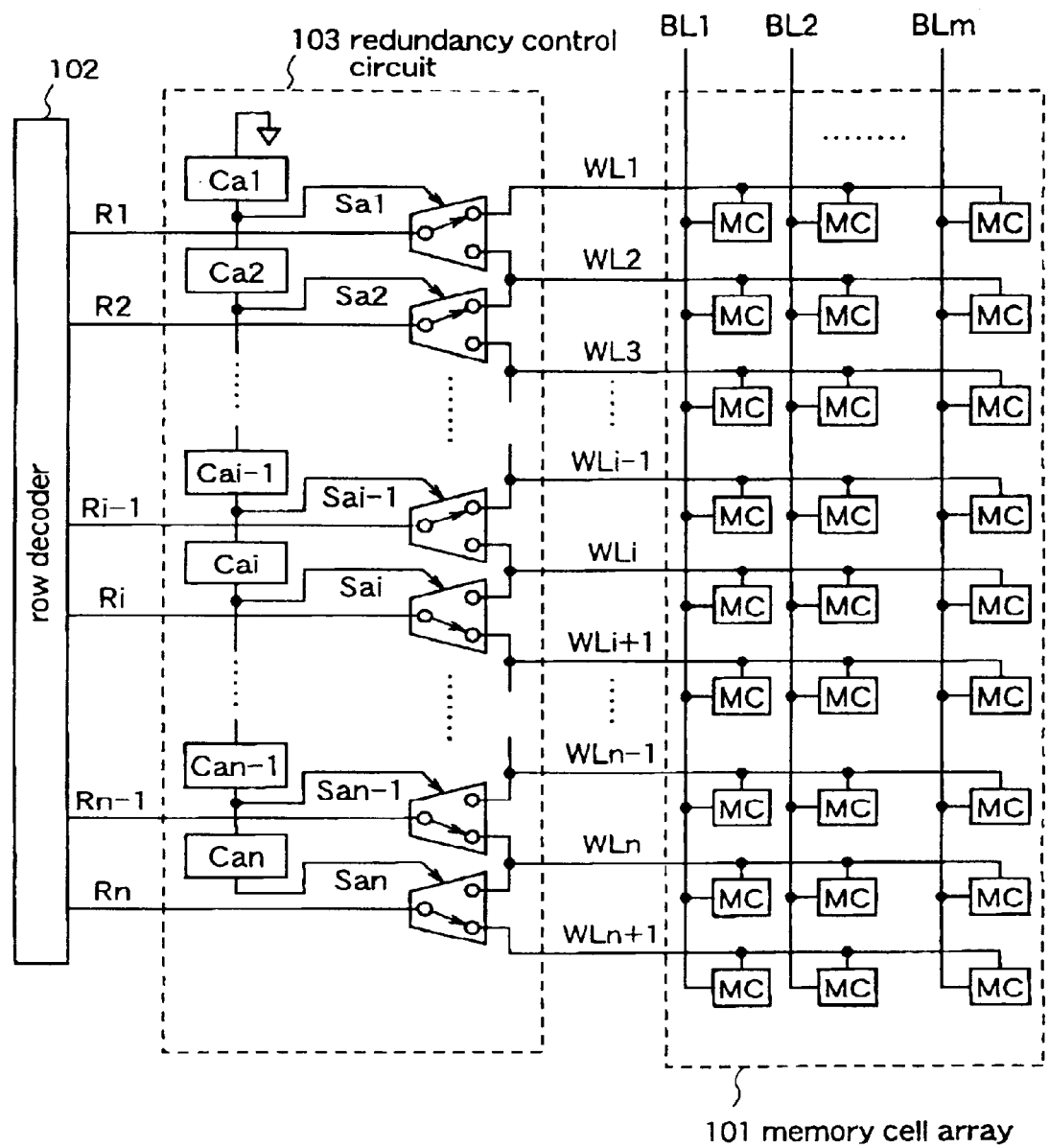
FIG. 7 is a circuit diagram illustrating a prior art semiconductor memory.

FIG. 6 is a block diagram illustrating a semiconductor memory according to a fourth embodiment of the present invention. In this figure, the same reference numerals as those in FIG. 5 denote the same or corresponding parts. A memory cell array 60 comprises plural nonvolatile memory cells which are arranged like a matrix. A part of the area in the memory cell array 60 is a redundancy information block RBLK which contains redundancy information including a defect address. The remaining data area consists of (l+2) erase blocks BLK1~BLK(l+2) (l: positive integer) arranged successively in units of erase blocks each being constituted by a prescribed number of (two or more) word lines which are arranged successively. Here, the redundancy information having a plurality of the same defect addresses or the redundancy information having an error correction code added thereto is recorded in the redundancy information block RBLK. A block decoder 21 decodes a block address in the input row address, and outputs a block selection signal for selecting the erase block and redundancy information block in the memory cell array 60 through output signal lines B0~Bl, respectively. The output signal lines B1~Bl are connected to the redundancy control circuit 3. The output signal line B0 is input to a row-in-block decoder 22, and used for selecting the redundancy information block RBLK. The redundancy control circuit 3 has a similar structure to that of the redundancy control circuit as described in the first embodiment. However, in this case, the n detect address decoder cells, the (n+1) control cells and the (n+1) selection circuits are replaced with l defect address decoders, (l+1)

control cells and (l+1) control circuits. In place of the n output signal lines from the row decoder, the output signal lines B1~Bl of the block decoder are connected to the redundancy control circuit. The (l+1) control circuits respectively control switching of the input signal lines from the row-in-block decoder, in place of the word lines. The row-in-block decoder 22 selects the word line in accordance with the block selection signal and address which are output through the redundancy control circuit 3. A register unit 64 has almost the same structure as that of the register unit in the first embodiment. The register unit 64 is different from the register unit in the first embodiment in that the register unit 64 holds the defect address which is read from the redundancy information block RBLK, like the register unit as described in the third embodiment. A power-on detection circuit 8 detects that the semiconductor memory itself is powered on, and outputs an operation start signal to a data reading control circuit 6. The data reading control circuit 6 receives the operation start signal, and starts control for replacing the defective memory cell with the redundant memory cell.

Hereinafter, the operation of the semiconductor memory according to the fourth embodiment will be described. The process of setting the redundancy information in the register unit 64 is controlled by the data reading control circuit 6. The power-on detection circuit 8 detects that the semiconductor memory is powered on, and outputs a signal instructing the data reading control circuit 6 to start the reading of the redundancy information. Upon receipt of the signal, the reading control circuit 6 controls the block decoder 21 and data reading means 5 to read the redundancy information from the redundancy information block RBLK. Then, the redundancy information which is output by the data reading means 5 is input to the data decision means 7, the data is corrected as needed and then sent to the register unit 64.

The subsequent operations for replacing the defective memory cells with redundant memory cells by the redundancy control circuit 3 are principally the same as those described in the first embodiment. However, the defective memory cells are replaced with the redundant memory cells in word line units in the first embodiment while the defective memory cells are replaced with the redundant memory cells in erase block units in this fourth embodiment.

When the nonvolatile semiconductor memory replaces the defective memory cells in word lines with the redundant memory cells using the spare word lines, not in erase block units, erasure or writing disturbance occurs in the defective word line, whereby the threshold voltage of memory cells on the defective word line is changed. Therefore, there is a risk of interfering with the operation of the memory. However, according to the fourth embodiment, since the defective memory cells are replaced with the redundant memory cells in erase block units, the block which is to be replaced with the redundant block has no erasure disturbance and has a suppressed or no writing disturbance, whereby the above-described interference is avoided.

As described above, according to the fourth embodiment, the same effects as those in the third embodiment can be obtained. Besides in this fourth embodiment, the memory cell array 60 consists of the plural erase blocks each including the prescribed number of word lines arranged successively, and the defective memory cells are replaced with the redundant memory cells in the erase block units. Therefore, the interference at the reading, erasure and writing, resulting from the memory cells on the defective word line can be avoided.

Further, the power-on detection circuit 8 for detecting that the semiconductor memory is powered on is provided, the reading of the redundancy information and the setting of the information in the register unit 64 is performed when the memory is powered on, and the control contents of the redundancy control circuit 3 are decided in the semiconductor memory. Therefore, when the memory is activated, the control contents of the redundancy control circuit 3 can be decided without the control from outside, such as a microcomputer.

In this fourth embodiment, one defective erase block is replaced with the redundant block. However, two or more defective erase blocks can be replaced. Also in this case, the same effects as those of the above-described example can be obtained. For example when up to two defective erase blocks are to be replaced, the redundancy control circuit and register unit used in the third embodiment are used in place of the redundancy control circuit 3 and register unit 64 in the fourth embodiment.

In addition, according to this fourth embodiment, the semiconductor memory which replaces the defective memory cells with the redundant memory cells in erase block units has the power-on detection circuit 8 for detecting that the memory is powered on, and the reading of the redundancy information and the setting of the information to the register unit 4 is performed when the memory is powered on. However, this structure having the power-on detection circuit can be applied to the semiconductor memory which replaces the defective memory cells with the redundant memory cells in word lines units as described in the third embodiment. Also in this case, the same effects as those described above can be obtained.

What is claimed is:

1. A semiconductor memory comprising:

a memory cell array comprising plural internal connection lines including at least one spare internal connection line, which are arranged successively, and plural memory cells, at least one of which memory cells is connected to each of the internal connection lines;

plural external connection lines which are arranged successively;

plural selection means, each of which is connected to one of the plural external connection lines and selects either an internal connection line of the plural internal connection lines which is in an arrangement order corresponding to an arrangement order of the connected external connection line or one of at least one internal connection line which is arranged subsequently to the internal connection line, thereby to connect the selected line to the external connection line;

a register unit holding an encoded address for specifying at least one defective internal connection line among the internal connection lines, as a defect address;

a defect address decoder for decoding the defect address output by the register unit and specifying the defective internal connection line; and plural control means which are provided in correspondence with the plural selection means, each control means controlling the selection of the internal connection line by each of the selection means, so as to select one of the plural internal connection lines except the defective internal connection lines for one of the plural external connection lines according to its arrangement order, on the basis of an output of the defect address decoder.

2. The semiconductor memory of claim 1 wherein
the control means are successively connected each other according to the arrangement orders of the corresponding plural external connection lines, each of the control means outputting a signal for controlling the selection of the internal connection line, to a corresponding one of the selection means and a control means just after that control means, as well as generating the signal for controlling the selection of the internal connection line, which is output to the corresponding one of the selection means, on the basis of a signal which is input by the defect address decoder and a signal for controlling the selection of the internal connection line, which is input by a control means connected just before that control means.

3. The semiconductor memory of claim 1 wherein
the plural internal connection liens are (n+2) (n is an positive integer) internal connection lines including two spare internal connection lines;
the plural external connection lines are "n" external connection lines;
the register unit holds up to two defect addresses for specifying up to two defective internal connection lines;
the plural control means are at least "n" control means; and
the plural selection means are at least "n" selection means, each selecting either an internal connection line of the (n+2) internal connection lines which is in the arrangement order corresponding to the arrangement order of the external connection line, or one of two internal connection lines which are arranged subsequently to the internal connection line, and connecting the selected internal connection line to the external connection line.

4. The semiconductor memory of claim 3 wherein
the memory cell array consists of plural nonvolatile memory cells which are arranged in a matrix; and
the internal connection lines are word lines and spare word lines of the memory cell array.

5. The semiconductor memory of claim 1 wherein
the register unit internally has redundancy information recording means comprising plural fuse elements or plural nonvolatile memory cells, and keeps the defect address in the redundancy information recording means.

6. The semiconductor memory of claim 5 wherein
the memory cell array consists of plural nonvolatile memory cells which are arranged in a matrix; and
the internal connection lines are word lines and spare word lines of the memory cell array.

7. The semiconductor memory of claim 1 comprising the control means and the selection means, numbers of which means are both equal to a number of the internal connection lines,
said control means controlling the selection means, respectively, thereby selecting all of the memory cells including the memory cell connected to the spare internal connection line at the time of examination of the memory cell array.

8. The semiconductor memory of claim 7 wherein
the memory cell array consists of plural nonvolatile memory cells which are arranged in a matrix; and
the internal connection lines are word lines and spare word lines of the memory cell array.

9. The semiconductor memory of claim 1 comprising:
the memory cell array including a redundancy information block having plural memory cells which contain redundancy information including the defect address;
data reading means for reading the data which are stored in the memory cell array; and
reading control means for controlling the data reading means to read the defect address from the redundancy information block and store the read defect address in the register unit.

10. The semiconductor memory of claim 9 comprising:
the redundancy information comprising the defect address and information for correcting errors in the defect address; and
data decision means for subjecting the redundancy information which is read from the redundancy information block by the data reading means to the error correction, extracting the defect address, and outputting the defect address to the register unit.

11. The semiconductor memory of claim 9 comprising:
power-on detection means for detecting the semiconductor memory is powered on;
the memory cells in the redundancy information block comprising nonvolatile memory cells; and
the reading control means for controlling the data reading means to read the redundancy information from the redundancy information block and store the defect address in the read redundancy information in the register unit, when the power-on detection means detect the semiconductor memory is powered on.

12. The semiconductor memory of claim 9 wherein
the memory cell array consists of plural nonvolatile memory cells which are arranged in a matrix; and
the internal connection lines are word lines and spare word lines of the memory cell array.

13. The semiconductor memory of claim 1 wherein
the memory cell array consists of plural nonvolatile memory cell which are arranged in a matrix; and
the internal connection liens are word lines and spare word lines of the memory cell array.

14. The semiconductor memory of claim 13 wherein
the memory cells are floating gate type nonvolatile memory cells.

15. A semiconductor memory comprising:
a memory cell array comprising plural erase blocks including a spare erase block, which are arranged successively, in units of erase blocks each consisting of plural internal connection lines which are arrange successively and plural memory cells, at least one of which memory cells is connected to each of the internal connection lines;
a block decoder for selecting one of the erase blocks;
a row-in-block decoder for selecting one of the internal connection lines in the erase block selected by the block decoder;
plural selection means which are respectively connected to plural outputs of the block decoder, which are arrange successively, each of the selection means selecting either an input to the row-in-block decoder in an arrangement order corresponding to an arrangement order of an output of the block decoder among plural inputs to the row-in-block decoder which are arranged successively, or one of at least one input to the row-in-block decoder which is arranged subsequently to the input, and connecting the selected input to the output of the block decoder;

a register unit holding an encoded address for specifying an input corresponding to a defective erase block among the plural inputs to the row-in-block decoder, as a defect address;

a defect address decoder for decoding the defect address output by the register unit, to specify one of the inputs to the row-in-block decoder, corresponding to the defective erase block; and control means which are provided in correspondence with the plural selection means, each of the control means controlling the selection of the input to the row-in-block decoder by each of the selection means on the basis of an output of the defect address decoder so as to select, for each of the plural outputs of the block decoder, one of the plural inputs to the row-in-block decoder except the input to the row-in-block decoder corresponding to the defective erase block, in accordance with the arrangement order.

16. The semiconductor memory of claim 15 comprising:

the memory cell array comprising a redundancy information block having plural memory cells which contain redundancy information including the defect address;

data reading means for reading the data stored in the memory cell array; and reading control means for controlling the data reading means to read the redundancy information from the redundancy information block and store the defect address in the read redundancy information in the register unit.

17. The semiconductor memory of claim 2 wherein the memory cell array consists of plural nonvolatile memory cells which are arranged in a matrix; and the internal connection lines are word lines and spare word lines of the memory cell array.

* * * * *